United States Patent [19]
Fettweis et al.

[11] Patent Number: 5,430,744
[45] Date of Patent: Jul. 4, 1995

[54] METHOD AND MEANS FOR DETECTING PARTIAL RESPONSE WAVEFORMS USING A MODIFIED DYNAMIC PROGRAMMING HEURISTIC

[75] Inventors: Gerhard P. Fettweis, Berkeley; Razmik Karabed, San Jose; Paul H. Siegel, San Jose; Hemant K. Thapar, San Jose, all of Calif.

[73] Assignee: International Business Machines Corporation, Armonk, N.Y.

[21] Appl. No.: 129,904

[22] Filed: Sep. 30, 1993

[51] Int. Cl.⁶ .................... G06F 11/10; H03M 13/00; H04L 25/34; H04L 25/49
[52] U.S. Cl. ........................................ 371/43; 375/290
[58] Field of Search ...................... 371/43–45; 375/18

[56] References Cited
U.S. PATENT DOCUMENTS

| | | | |
|---|---|---|---|
| 4,571,734 | 2/1986 | Dolivo et al. | 375/18 |
| 4,644,564 | 2/1987 | Dolivo et al. | 375/18 |
| 5,291,524 | 3/1994 | Itakura et al. | 371/43 |
| 5,295,142 | 3/1994 | Hatakeyama | 371/43 |

OTHER PUBLICATIONS

"High-Speed Parallel Viterbi Decoding: Algorithm and VLSI-Architecture" Gerhard Fettweis and Heinrich Meyr—May 1991 IEEE Communications Magazine.

*Primary Examiner*—Roy N. Envall, Jr.
*Assistant Examiner*—Emmanuel Moise
*Attorney, Agent, or Firm*—R. Bruce Brodie; Paik Saber

[57] ABSTRACT

A Viterbi decoder having a recursive processor modified to process each node in a trellis of a partial response coded signal to shift the branch metric additions over the node to effectuate compare, select, add operation order on the predecessor survivor metrics terminating in that node, to compare the metrics of the predecessor sequences terminating in the node, to select a survivor sequence, and to add the shifted branch metrics to the metric of the selected survivor sequence.

9 Claims, 13 Drawing Sheets

$1-D^2 \longrightarrow 1-D$ ON INPUTS IN EVEN POSITIONS
$1-D^2 \longrightarrow 1-D$ ON INPUTS IN ODD POSITIONS

GENERIC 2-STATE
BUTERFLY TRELLIS

LEFT SHIFTING
ADDITION OF
BRANCH METRICS a & b

RIGHT SHIFTING
ADDITION OF
BRANCH METRIC −a+b
OVER A MAX/MIN NODE

COMPARE/SELECT UNIT OF FIG.10

METHOD AND MEANS FOR DETECTING PARTIAL RESPONSE WAVEFORMS USING A MODIFIED DYNAMIC PROGRAMMING HEURISTIC

FIELD OF THE INVENTION

This invention relates to the maximum likelihood decoding of convolutional codes, and more particularly, to Viterbi decoding of said codes and especially of partial response waveforms.

DESCRIPTION OF RELATED ART

This invention treats reducing complexity in implementation of Viterbi decoding of partial response waveforms. To appreciate this advance, several aspects of the art are briefly described. These include communication path constraints and the use of convolutional coding to match the characteristics of the path; Viterbi decoding of convolutional coded sequences and the trellis representation thereof; and partial response channels, codes, and waveforms.

Channel and Signal Codes and Communication Over Noisy Paths

Generically, a communications system comprises an information source, an encoder, a noise free or noisy channel, a decoder, and a sink. Relatedly, Shannon's theorems on information theory state that signal power, channel noise, and available bandwidth limit the communication rate in bits/second over the channel. Also, there exist numerous signals or processes on the channel extraneous to source generated information which may alter or obliterate the information.

The error or erasure of an encoded symbol string on the channel or portion thereof due to noise, jitter or other cause is manifest as an undesired modulation of the string in time or amplitude. This results in a received code string being either mistakenly identified or not identified at all. To reduce the effects of such channel originated disturbances, communications systems encoders have used channel and signal modulation encodings. A channel code adds redundancy to a bit string from the source while a signal encoding enhances waveform detectability of the waveform such as by preserving timing information or the like. Some techniques combine aspects of both.

Convolutional Codes

Convolutional codes are a general class of channel and signal encodings used in both communications and in magnetic recording.

A (n,k,m) convolutional code is a set of encoded sequences produced by a k-input, n-output encoder of memory order m having a code rate $R=k/n$ and $k<n$. That is, a convolutional encoder generates n output bits for every $k<n$ input bits. The performance of any particular convolutional code such as a (3,1,2) or a (2,1,16) depends upon the decoding algorithm employed and the distance properties. Advantageously, convolutional codes are employed as channel codes because they expand the number of bits per codeword and reduce the noise per bit. A convolutional signal encoding such as the partial response 4 (PR4) behaves in the manner of a digital filter thereby permitting spectral shaping via controlled intersymbol interference.

Convolutional encoding can be represented and executed on a finite state machine as the discrete time convolution of an input binary sequence with the impulse response of the encoder.

Viterbi Decoding

The combination of convolutional codes with Viterbi decoding has become a widely used forward error correction technique. Decoding a convolutionally coded sequence with minimal storage requires beginning the decode process before the entire codeword is received. It is known that codewords correspond to directed walks or traverses through a state diagram. The Viterbi decoding algorithm is an alternate way of viewing a code tree or state diagram. To the extent that a tree code may be mapped onto a graph, Viterbi detection is equivalent to the dynamic programming problem of finding the shortest path through a weighted directed graph (trellis).

The Viterbi decoder is used to produce the maximum likelihood estimate of a transmitted sequence over a band limited channel with intersymbol interference. That is, the Viterbi decoder selects that sequence from the set of possible noiseless channel output sequences which minimizes a distance metric with respect to the sequence of received samples such as the sum of the squared errors of the received sequence. In this sense, the Viterbi decoder is also performing an error correction function.

Trellis Representation of a Convolutional Encoder or Decoder As a Time Sequenced State Diagram As indicated above, the Viterbi algorithm uses a trellis as a graphical construct in decoding. A "trellis" is a directed graph whose nodes are the encoder state at time k. With each source symbol, a branch associated therewith goes from a state at time k to a state at time $k+1$.

Restated, a trellis is an expanded state diagram of a convolutional encoder over time. That is, each time unit is represented by a separate state diagram where the number of binary states N is $2^{(m-1)}$ and m is the constraint length of the code (the number of shift register stages necessary in the coder).

The significance of the trellis view point is that the number of nodes in the trellis does NOT continue to grow as the number of binary input symbols increases but remains at $2^{(m-1)}$.

Partial Response Channels, Coding and Waveforms

The texts on information, communication, and coding theory such as Hill, "A First Course in Coding Theory", copyright 1986 by Oxford University Press; Clark et al, "Error Correction Coding for Digital Communications", copyright 1981 by Plenum Press; Goldie et al, "Communication Theory", copyright 1991 by Cambridge University Press generally treat communication rather than magnetic or optical recording channels. This textbook sparseness is partially remedied by Watkinson, "Coding for Digital Recording", copyright 1990 by Focal Press.

Watkinson points out that magnetic recording channels differ in part from communications channels through inclusion of a read/write head and magnetic disk (also known as a head, disk, and accessing arm assembly or HDA). The HDA acts as a linear filter because its frequency response resembles that of a cascade formed from a differentiator and low pass filter. Also, a magnetic recording channel can be modeled as a system whose intersymbol interference is approximated by a partial response channel with a 1−D, 1−D², or 1+D−D²−D³ frequency impulse response. A binary coded pulse train of 1's and 0's (or generally +a,−a) presented to such a system in the write direction results in a ternary output of +1's, 0's, and −1's (or +c,d,−c). Watkinson explicitly mentions partial response class 4 codes (PR4). Other references describe extensions to PR4 sometimes denominated as extended PRML or EPRML.

In order to form a channel code and whence match the input signal to the channel in the write direction, the binary signal is mapped into a ternary signal sequence by the combination of the read/write head and an analog to digital converter taking intersymbol interference into account. In the read direction, sequences of ternary signals are Viterbi decoded so as to generate binary strings of 1's and 0's. Partial response coding consequently combines both a channel code as a form of convolutional coding and a signal code or waveform.

Viterbi Decoding, Paths Through The Trellis, Computation of Metrics, and Complexity Fettweis et al, "High Speed Parallel Viterbi Decoding", IEEE Communications Magazine, May 1991, pp.46–55, points out that a trellis shows the transition dynamics in the form of a two dimensional graph for any given discrete-time finite state machine with N states where the transition diagram and transition rate of 1/T are constant in time. This graph is described in the vertical direction in N states s(i) and in the horizontal direction by time instances kT(T=1). The states of time instance k are connected with those of time k+1 by the branches of the time interval (k,k+1).

Fettweis also notes that the Viterbi decoder is such a finite state machine as described above. In decoding, the Viterbi decoder chooses a path through the trellis as a function of the state transitions and the branch metrics in time interval (k,k+1). An optimum path through the trellis is determined recursively by the decoder by computing a value for each path counterpart to each of the N states or nodes at time k. The N new optimum paths of time k+1 are a function of the metrics of the old paths and the branch metrics of the interval (k,k+1). That is, at any time k there is recursively computed a path metric for each node which represents a maximum or a minimum of the metrics of all paths terminating in that node dependening on manner of formulating the issue. A unique or best path of the set of N decoded paths through the trellis is obtained by tracing each path back in time and selecting the one path which is the minimal distance metric among the set of N.

According to Fettweis, a Viterbi decoder comprises a pipeline of three units, namely, a branch metric unit (BMU), an add-compare-select unit (ACSU), and a survivor-memory-unit (SMU). Functionally, channel coded data is applied to the BMU. The BMU in turn calculates a set of branch metrics for each new time step. These metrics are then applied to the ACSU. Responsively, the ACSU accumulates the branch metrics recursively as path metrics according to the r-th ACS recursion. Lastly, the SMU stores the decisions made in the ACSU and outputs the estimated path in the form of an original data sequence that was most likely applied to the channel encoder.

SUMMARY OF THE INVENTION

It is accordingly an object of this invention to devise a Viterbi type decoder having substantially reduced complexity.

It is a related object that the Viterbi decoder achieve such reduced complexity without increasing decoding delay.

It is yet another object of this invention to devise a method and means for Viterbi decoding channel coded sequences using simplified trellis maximization or minimization and distribution node processing.

It is still another object to devise a method and means for Viterbi decoding of channel coded sequences of the partial response type and such decoding be operable either as a matched filter (MF) or as a whitened matched filter (WMF).

The objects of this invention are satisfied by modifying the Viterbi detection of partial response waveforms as projected onto a labeled, directed-graph based trellis by a dynamic programming heuristic through changing the order of operations at each node in the trellis as processed by the heuristic. The changed order results in a substantially simplified and component reduced processing such that N states require approximately N adders or accumulators rather than 2N adders as used in the prior art.

In this invention, the prior art ordered set of add-/compare/select operations to ascertain survivor sequences at each trellis node is replaced by the ordered set of compare/select/add operations. As subsequently described, the reduction in components and also power dissipation derives from the fact that the transformed trellis structures for maximum likelihood (Viterbi) detection on binary partial-response channels approximate 1 adder per trellis state.

It should be appreciated that the method and means for Viterbi decoding according to the invention comprise the steps or function of (a) changing the order of the operations (compare, select, add) in each ordered set by shifting the branch metric additions over the nodes of the graph; (b) selecting a survivor sequence at each node by comparing the metrics of each predecessor survivor sequence terminating in that node, each predecessor survivor sequence being incremented by at most a constant value independent of the recursive step; and (c) adding the shifted branch metrics to the metric of the survivor sequence at each node.

DESCRIPTION OF THE PREFERRED EMBODIMENT

Figure 1:
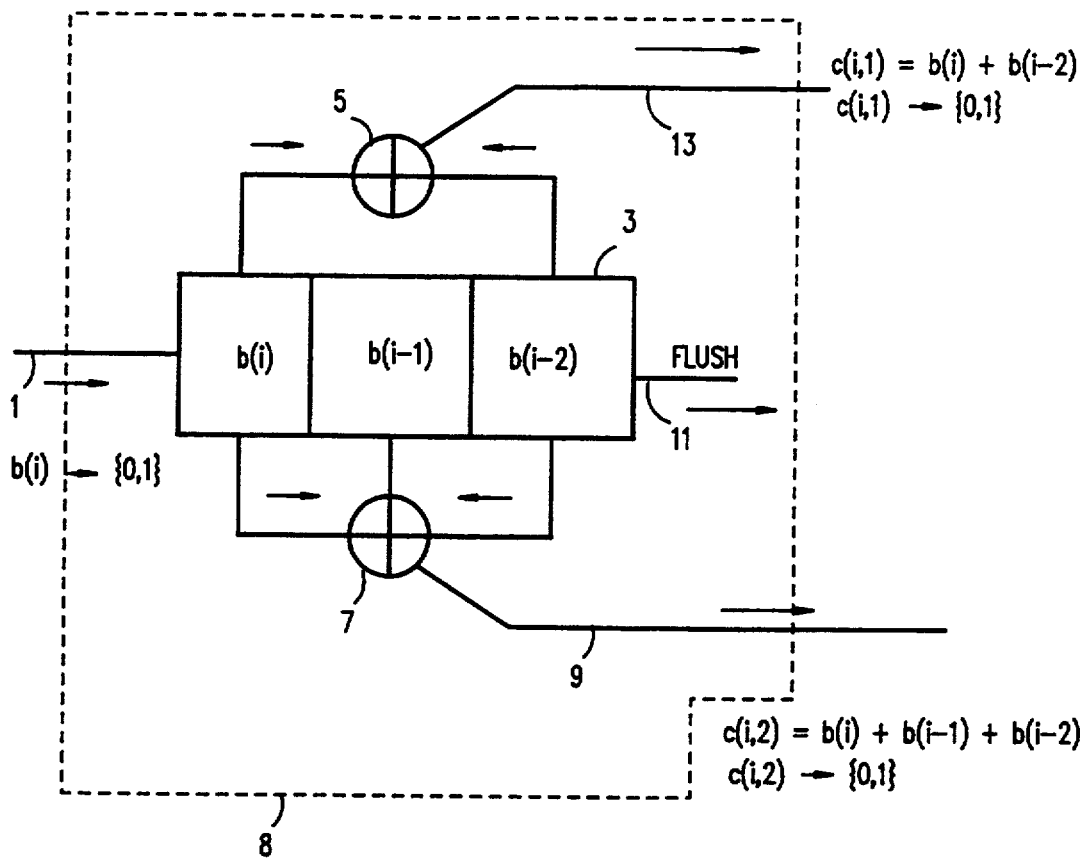
FIG. 1 a convolutional encoder according to the prior art.

Referring now to FIG. 1, there is shown a convolutional encoder 8 according to the prior art. A binary bit string b(i) is applied to a shift register 3. Outputs c(i,1) and c(i,2) on paths 13 and 9 are obtained by suitably "convolving" the impulse functions of the encoder as the XOR of the contents of predetermined shift register stages. Stated another way, this encoder is a finite state machine with a "memory" wherein the output is a function of the input and the "state" of the machine. In this regard, c(i,1) is taken as the XOR 5 of the b(i) and b(i-2) register 3 stages while c(i,2) is taken as the XOR 7 of the b(i), b(i-1), and b(i-2) register stages. That is, for each "0" or "1" bit applied at the input 1, a pair of bits c(i,1) and c(i,2) are generated on outputs 13 and 9 taking into account b(i) and previous bit inputs within a predetermined range or span. Register 3 shifts from left to right such that the current contents of the b(i-2) position are flushed out on path 11 or otherwise overwritten as the current contents from the b(i-1) position are right shifted by one position during the next code cycle.

If c(i,j) designates the ith bit of encoder output j, then each c(i, j) is a unique XOR polynomial function of the Boolean values of designated shift register stages. This means that different convolution codes will form outputs with more or less elaborate logical combinations of the present and past input bits i.e. a (3,1,2) code differs from a (2,1,16) code. The first has a ⅓ rate (generates 3 output bits for each input bit expressed by 3 impulse functions) while the second has a ½ rate. The first spans two register positions back while the second spans some 16 register positions to determine outputs.

Figure 2:
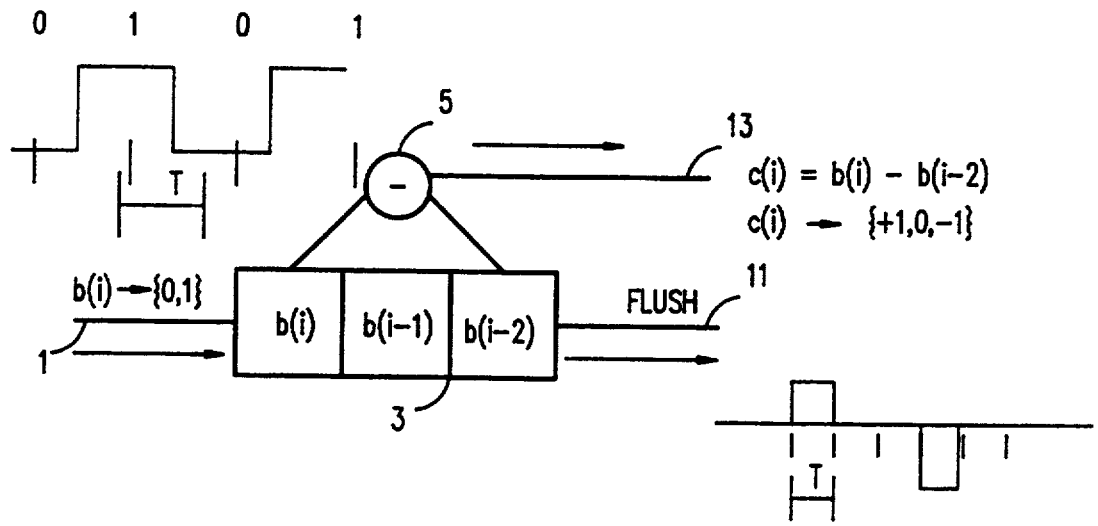
FIG. 2 depicts a prior art partial response waveform encoder and state diagram.
Figure 2:
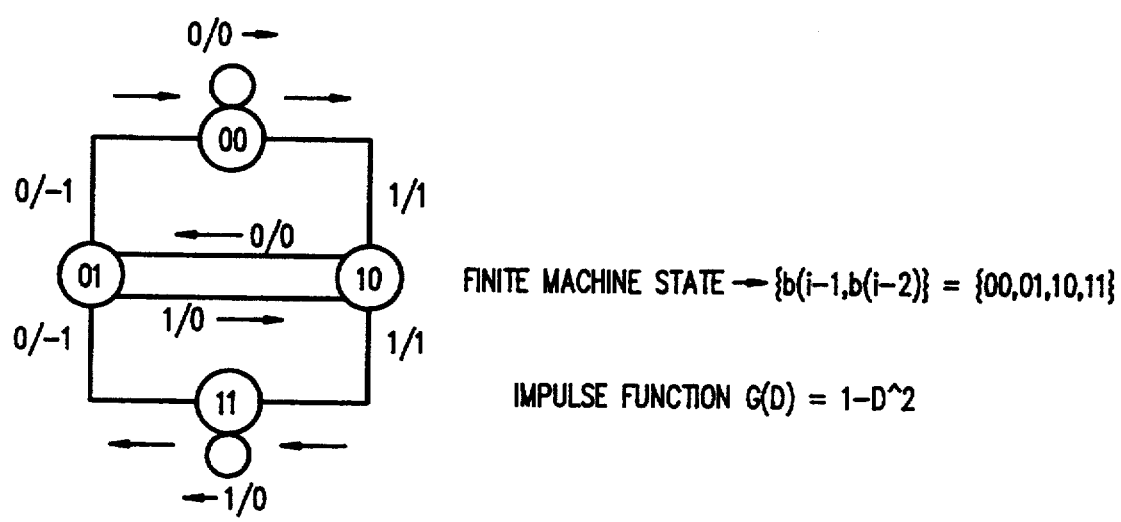

Referring now to FIG. 2, there is shown a partial response waveform encoder and state diagram. This encoder type combines aspects of a convolutional channel coder and a signal coder. Its impulse response ($G(D)=1-D^2$, where D=unit delay) more nearly matches the characteristics of a magnetic recording channel. A binary input waveform is depicted as being sampled at a rate 1/T sufficient to detect changes between binary amplitude levels. A ternary output is generated at the same rate.

In the partial response encoder of FIG. 2, the binary input is applied on path 1 to a shift register 3. The encoder output c(i) taken on path 13 is a ternary function $\{+1,0,-1\}$ of the b(i) and b(i-2) register states as formed by the differencer 5. The two register stages b(i-1), b(i-2) provide four distinctive finite machine states, namely, $\{00, 11, 10, 01\}$. The encoder inputs and outputs label each of the transitions between the states such that at state 00, a 0 input will result in a 0 encoder output and the encoder will remain in the 00 state. This is expressed as "0/0". In contrast, starting in the 00 state a 1 input results in a 1 output and a transition to the 10 state. Likewise, a 1 input in the 10 state generates a 1 output and a transition to the 11 state etc. Now, a "$-1$" output is obtained when the encoder is in either the 11 or 01 states and the input is a 0.

Figure 3:
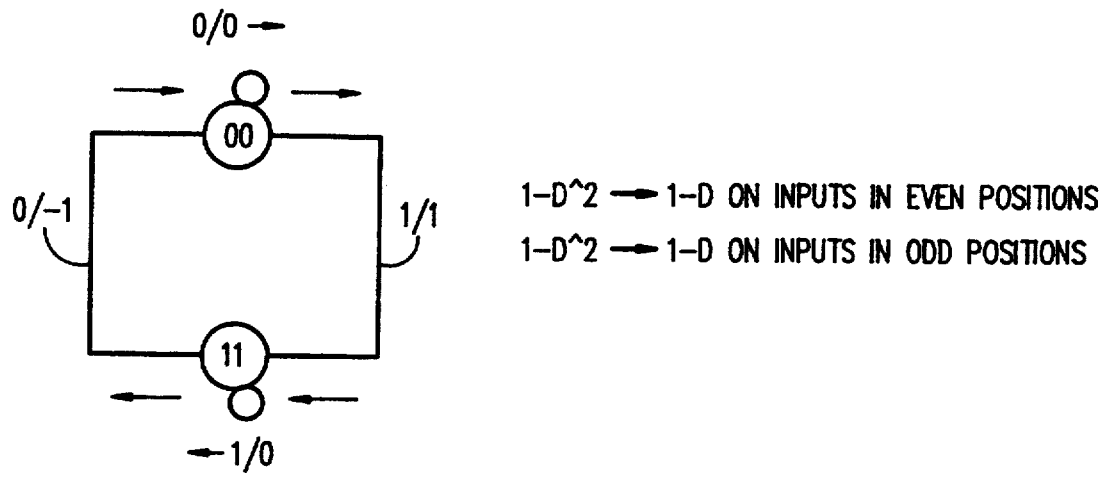
FIG. 3 sets out a state diagram and trellis for the partial response encoder of FIG. 2, for even or odd interleaved subsequences with DICODE encoding.
Figure 3:
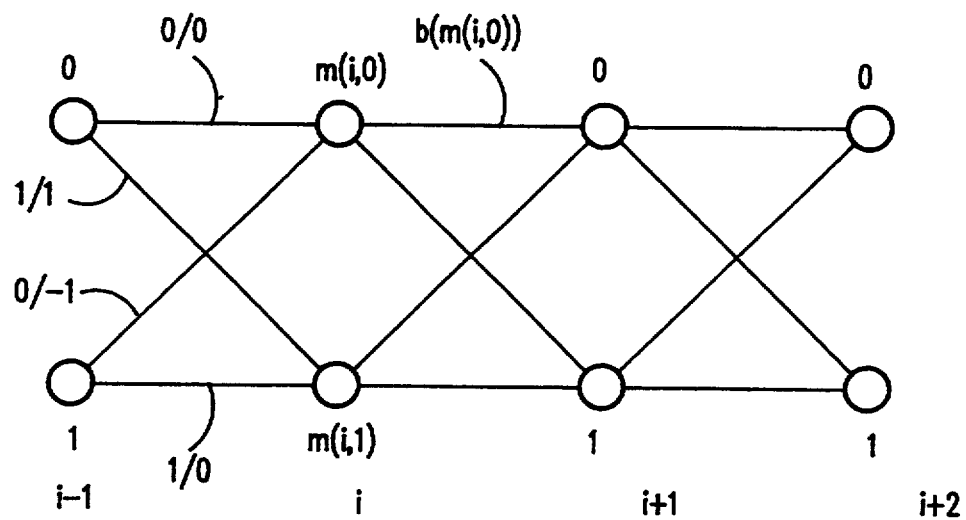

Referring now to FIG. 3, there is shown a state diagram and a trellis for a dicode partial response code. The impulse response $1-D^2=(1-D)(1+D)$ translates into a $1-D$ response to binary inputs sampled in even numbered periods and a $1-D$ response to binary inputs sampled in odd numbered periods. The state diagram for such a response is depicted as a two state machine with 1 bit memory where $c(i)=b(i)-b(i-1)$. If the encoder is in state 0 it remains in state 0 and outputs a 0 for each 0 input. A 1 input causes a 1 output and a transition from state 0 to state 1. Similarly, a 1 input in state 1 causes a 0 output and the encoder remains in that state. In contrast, a 0 input results in a $-1$ output and a transition from the 1 to the 0 state.

As shown in FIG. 3, a "trellis" is a directed graphical construct whose nodes are the encoder state at time i. With each source symbol a branch associated therewith goes from a state at time i to a state at time i+1. The ordinate indicates the states represented as in the state diagram as nodes while the abscissa indicates the stages or time interval. Thus, an input sequence 1, 0,1 starting at interval i-1 in state 1, would yield a 0, $-1,1$ ternary output. If encoding started in state 0, then the output sequence would be 1, $-1,0$. Ordinarily, a default state would be used to resolve any ambiguity.

Figure 4:
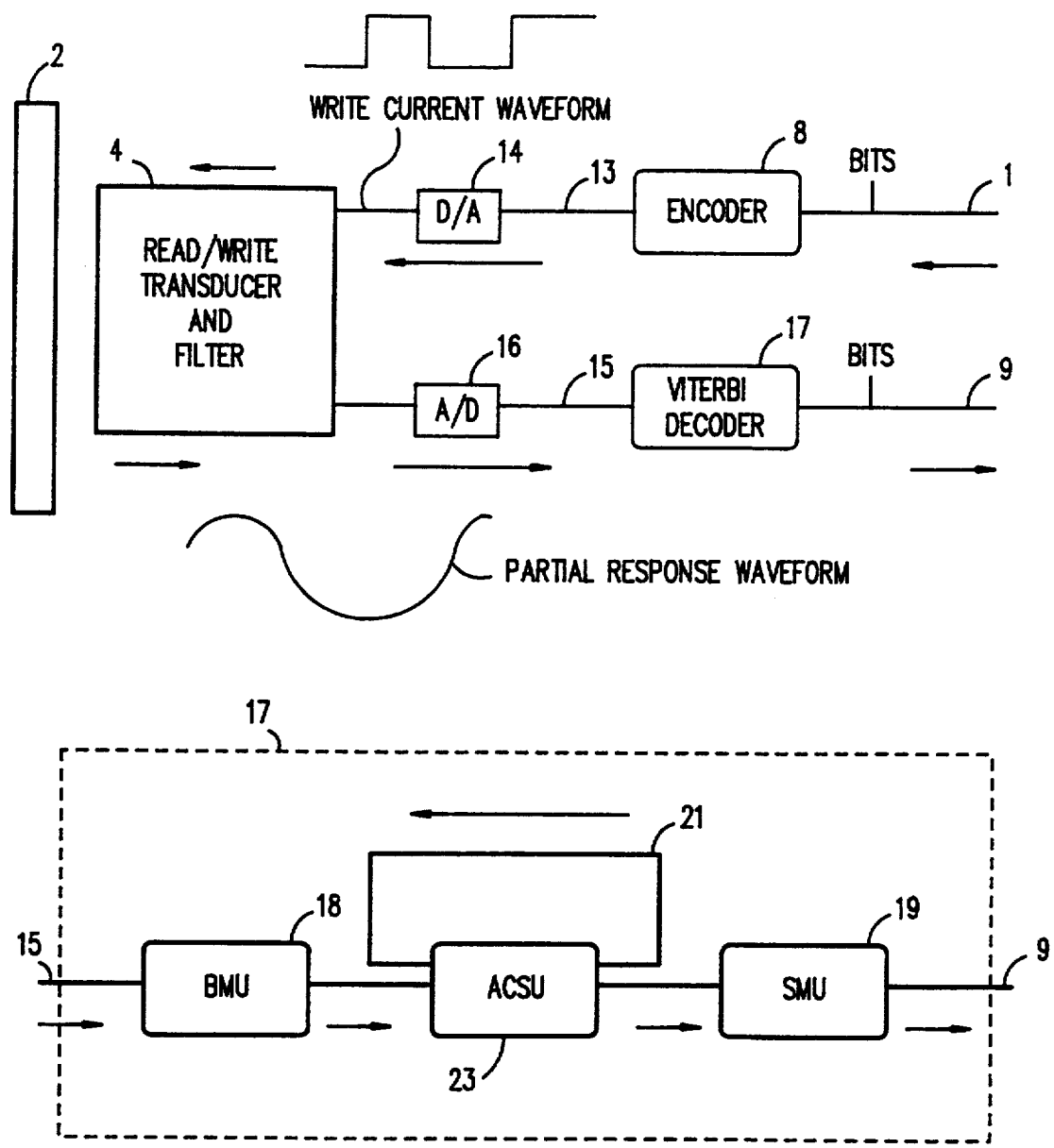
FIG. 4 places the prior art Viterbi decoder in its recording channel setting.

Referring now to FIG. 4, there is shown a Viterbi decoder and encoder and its setting in a magnetic recording channel. A read/write transducer or head and filter assembly 4 either alters the magnetic state of medium 2 along a track when writing or senses the state of the track while reading. A binary sequence is applied to an encoder 8. The sequence from encoder 8 is applied to digital-to-analog converter (D/A) 14. A time varying analog output from D/A 14 is in turn applied to head and filter assembly 4 in the write direction. Likewise, a time varying analog output from the head and filter assembly 4 is applied to analog-to-digital (A/D) converter 16. The partial response output therefrom is applied to Viterbi decoder 17 over path 15 in the read direction. The Viterbi decoder generates a bit stream out on path 9 of its best estimate as to the data originally encoded and recorded on the magnetic medium. Parenthetically, DICODE output is $\{0,+1,-1\}$, PR4 output is $\{0,+1,-1\}$, and EPR4 output is $\{0,+1,-1,+2,-2\}$.

In FIG. 4, there is shown a logic organization of a Viterbi decoder 17. The decoder comprises a branch metric unit (BMU) 18, an add_compare_select unit (ACSU) 23 with a recursive or feed back path 21, and a survivor_memory_unit (SMU) 19. The ACSU processes each of the dicode or ternary symbols as represented by branch metrics as if it were along a trellis. This is done in a recursive computational manner. The most likely paths (sequences of binary symbols originally encoded) are stored on the SMU as the decoding proceeds with the best guess or most likely estimate being applied to the decoder output. The term "path" is appropriate since each possible symbol sequence has a unique path through the trellis.

It is well appreciated that for example in a (2,1,3) convolutional code that at level 3 for any node in the trellis there are two paths entering the node. Since those paths will be identical from that point on, a maximum likelihood decoder may make a decision at that point with no loss in performance. That is, the Viterbi decoder compares the two paths entering the node and only the path with the best metric is retained. The other path is discarded since its likelihood can never exceed that of the path which is retained no matter what data are subsequently received. The retained paths are called SURVIVORS. For an m=3, constrained code no more than four survivor paths will ever be retained in the SMU.

Branch Metric Shifting

The key for an M-step parallelization of the Viterbi decoder is the validity of the distributive law of addition and maximum selection:

$$\max (X+a, Y+a) = \max (X, Y) + a \quad (1)$$

This relationship is used in this invention to achieve higher speed and to reduce the implementation complexity of a Viterbi decoder.

Figure 5:
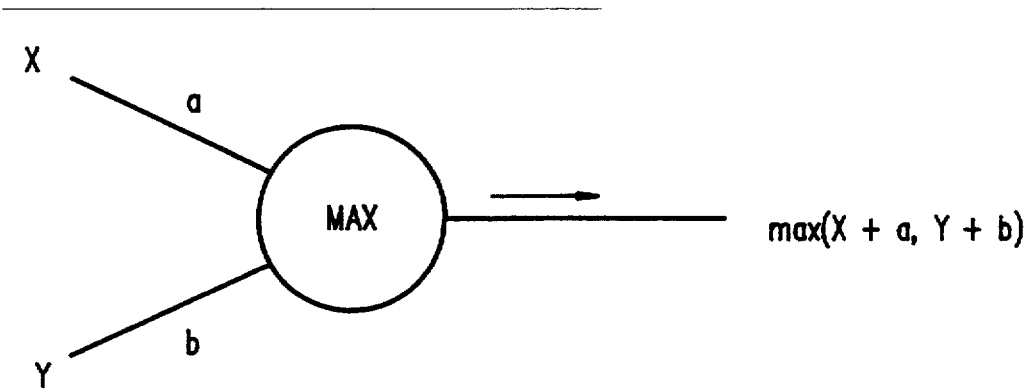
FIG. 5 shows the transformation of flow graph operations under the distributive law according to the invention.
Figure 5:
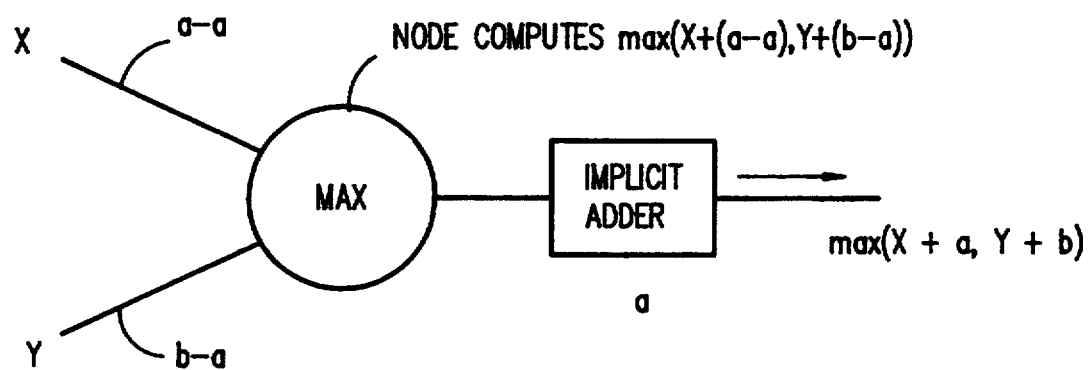

Referring now to FIG. 5, there is shown the transformation of flow graph operations under the distributive law. The fact that distributive law holds permits additions on branches to be shifted over maximization nodes. In the prior art, the values of "a" and "b" were added to the two variables "X" and "Y", respectively, before taking the maximum. This is the basis for characterizing the prior art operations sequence as "add-compare-select". This operation sequence can be transformed to an equivalent operation where the value "a" has been shifted over the maximization node, in compliance with the distributive law (1) i.e. where the node and subsequent addition compute $$\max(X+(a-a), Y+(b-a))+a = \max(X+a, Y+b).$$

That is, the node "compares" the path metrics and "selects" the path having the "best" metric among the paths terminating in that node to which is added the shifted quantity "a". This is repeated for each node in that stage for each of the stages in the trellis for the decoder.

Dynamic Programming, Multi-Stage Decision Processes, and Viterbi Decoding

Dynamic programming is an approach to optimizing multistage decision processes. It is based upon Bellman's "Principle of Optimality". A multistage decision process is a process that can be separated into a number of sequential steps or stages. The options for completing the stages are called decisions. A policy is a sequence of decisions, one for each stage of the process. The condition of a process at a given stage is called the state at that stage. Each decision causes a transition from the current state to a state associated with the next stage. A multistage decision process is finite only if there are a finite number of stages and a finite number of states associated with each stage.

Many multistage decision processes have returns (costs or benefits) associated with each decision and theses returns vary with both the stage and state of the process. The objective is to determine an optimal policy. In the Viterbi decoder, the objective to determine the most likely binary sequence that was originally channel encoded and recorded on the magnetic storage medium.

The dynamic programming and the ACSU iterations in the Viterbi decoder comprise the recursive steps of:

(a) starting with the last stage of an N stage process, determining for each state or node as for example in a trellis, the best policy for leaving that state and completing the process, assuming that all preceding stages have been completed.

(b) repeating step (a) on the immediately preceding stage, determining the best policy for leaving each state to go to the succeeding stage and completing the process, assuming that all preceding stages having been completed and making use of the results already obtained for the succeeding stage.

It should be noted that unlike the classic backward recursion direction of dynamic programming, the Viterbi algorithm is applied to convolutional codes recursively in a forward direction. That is, from first stage to last stage.

Transforming the Viterbi Decoding Trellis To Reduce Complexity

Figure 6A:
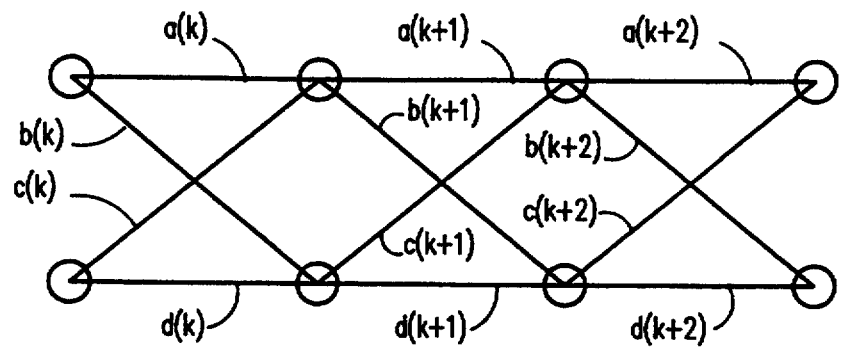
FIGS. 6A–6B show a trellis diagram for a 2 state Viterbi decoder and a two iteration trellis representation.

Referring now to FIG. 6A, there is shown a two state trellis for a Viterbi decoder. The trellis diagram, with its branch labels defined by the branch metrics, describes the algorithm that needs to be carried out. Unlabeled branches leaving a node correspond to the distribution of the node variable; branches labeled with branch metrics correspond to the addition of the branch metric to the node variable being distributed along the branch; and branches merging in a node correspond to selecting the maximum or minimum of all the variables into the node.

Figure 6B:
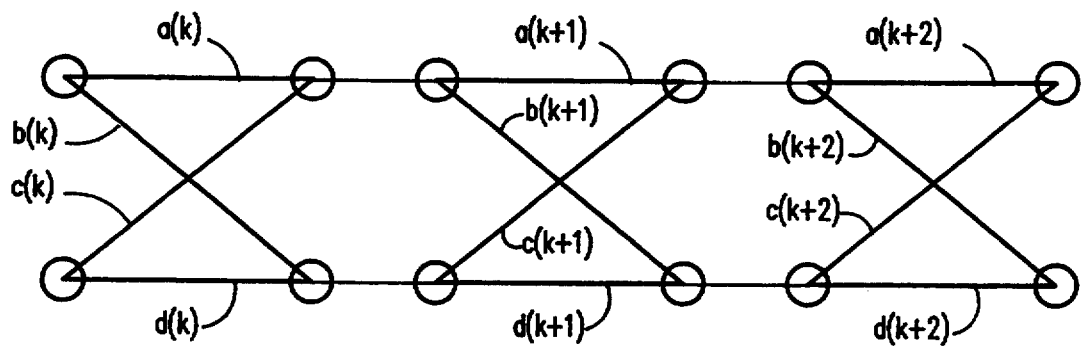

The trellis depicted in FIG. 6A can be redrawn as a 2-iteration trellis shown in FIG. 6B. In FIG. 6B, this results in separating the maximization and the distribution operations into two nodes. Note, branch metric shifting through a node applies not only to branch metric shifting through "maximization nodes" but also to shifting of branch metrics from the branches emanating from a given node back to its incoming distribution branch.

Figure 7A:
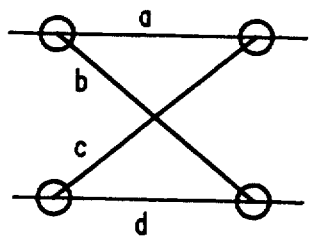
FIGS. 7A–7D depict the transformation effects upon a branch metric shifted 2-iteration trellis per the invention.
Figure 7B:
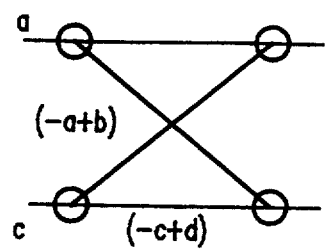
Figure 7C:
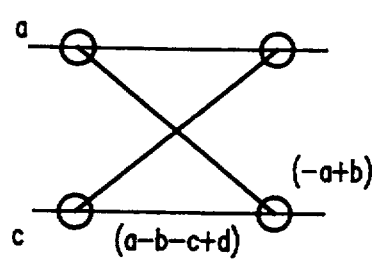
Figure 7D:
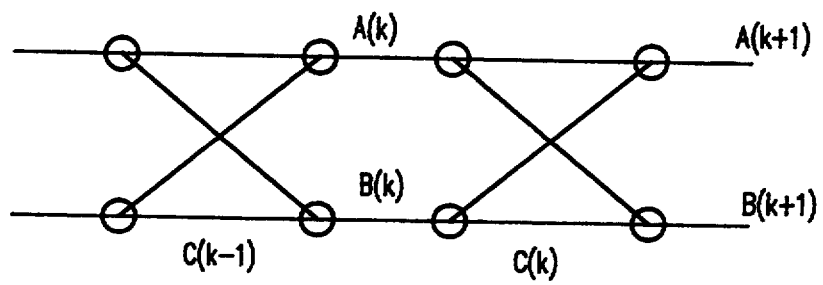

Referring now to FIG. 7D, there is shown a branch shifted, 2-iteration trellis, derived from the generic 2-state butterfly trellis shown in FIG. 7A. The butterfly trellis set out in FIG. 7A can be transformed into the butterfly trellis of FIG. 7B by shifting the two branch metrics "a" and "c" over the distribution nodes on the left. The butterfly trellis exhibited in FIG. 7C is obtained when the branch metric "$-a+b$" is shifted over the maximization nodes on the right, applying the distributive law as discussed in connection with FIG. 5.

The 2-iteration trellis of FIG. 7D results from combining the trellises shown in FIGS. 6A and 7C, such that $$A(k) = a(k);$$

$$B(k) = -a(k-1) + b(k-1) + c(k); \text{ and}$$

$$C(k) = a(k) - b(k) - c(k) + d(k)$$

In this specification the subscripted and superscripted variables in the mathematical relations are used interchangeably with the variables in which the indices are expressed parenthetically i.e.

$$A_k = a_k;\ B_k = -a_{k-1} + b_{k-1} + c_k;\ C_k a_k - b_k - c_k + d_k$$

It should be noted that in this case, the number of additions in the ACSU-loop of the Viterbi decoder is reduced from 4 to 3.

While it could be argued that two additions plus one maximum selection form the critical path of the ACS-loop causing a potential slow-down of the decoding speed, such a consequence is avoided by holding $C_k$ constant, i.e. $C_k = C$. In such a case, the fixed addition can be "hardwired", resulting in little, if any, loss in speed. A nominal increase in complexity of a few gates is all that is required to implement such a fixed addition.

The overall transformation described above converts the "add-compare-select" operation of the prior art into to the "compare-select-add" operation of this invention.

An insight into the nature of the complexity reduction obtained by holding $C(k) = C =$ constant is expressed by the following reasoning:

If the values of the path metrics are denoted by $p(0)$ for the upper state and $p(1)$ for the lower state at the beginning of the butterfly trellis, the two maximization nodes involve max(p(0), p(1) )

max(p(0), C+p(1))

This implies that: the two decisions are not independent of each other. If $C > 0$, then $p(0) < p(1)$ and $p(0) > p(1) + C$ cannot occur simultaneously. If $C < 0$, then $p(0) > p(1)$ and $p(0) < p(1) + C$ can never occur. Hence, only three of the four possible choices exist for different values of $p(0)$ and $p(1)$.

Second, the two comparators for the two maximum selections can share common hardware, since the difference of two numbers is compared to two levels, 0 and C. This reduces the complexity to that of approximately one adder in case of conventional binary arithmetic, as validated in the subsequent discussion of the two level compare/select.

Account should also be taken of the fact that any dynamic programming problem implemented by Viterbi detection that is described with additions/subtraction's on the branches and maximization's can be transformed into the equivalent problem of subtraction's/additions on the branches and minimization's on the nodes by sign-inverting all branch metrics (multiplying all branch metrics with $-1$), and vice versa.

Two Level Compare/Select

The two-level compare of two numbers A and B differs from the simple compare described above by the fact that now the decision has to be made upon A and B, and upon A+1 and B, simultaneously. Since a fixed-point arithmetic can be assumed, the numbers A and A+1 only differ in the upper n bit-levels. Hence, the carry-ripple circuit for the lower bit-levels can be shared for both compares. A half-adder chain needs to be implemented only at the upper n bit-levels to compute A+1, and an additional carry-ripple is needed for the compare. Therefore it can be seen that the total complexity of the compare and the two select-multiplexers is at most that of one adder.

In order to speed-up the computation cycle of one add-compare-select, the add can be carried out before the select operation has been completed, as described in the Fettweis reference. This can cut the latency of the critical path by up to approximately 40%. However, this requires doubling the adder and select hardware, as well as the wiring communication of the trellis between the different ACS path metric cells. As a result, this can lead to a favorable area-time tradeoff when the trellis wiring is not too complicated.

Class 4 Partial Response Embodiment

A "Class 4 Partial Response" (PR4) is defined in Dolivo et al, U.S. Pat. No. 4,571,734, issued Feb. 18, 1986 and U.S. Pat. No. 4,644,564, issued Feb. 17, 1987 as a channel coding method and means providing a $(1 - D^2)$ impulse response to an applied sampled bit stream in the recording channel write direction.

Maximum-likelihood detection of PR4 over an additive white Gaussian noise channel involves the selection of an allowed sequence of symbols that minimizes the sum of the squared-error between itself and the sequence of noisy observations.

The total error that needs to be examined may be written in terms of the samples $\{y_k\}$ and the data sequence $\{a_k\}$:

$$E = \sum_0^\infty (y_k - (a_k - a_{k-2}))^2$$

This is referred to as the "whitened matched filter" (WMF) case. The Viterbi algorithm, as a dynamic programming method, is applied to determine the sequence $\{a_k\}$ that minimizes E. Since the terms $(y_k)^2$ are common to E for all of the allowed sequences, they can be subtracted in the minimization operation.

Figure 8A:
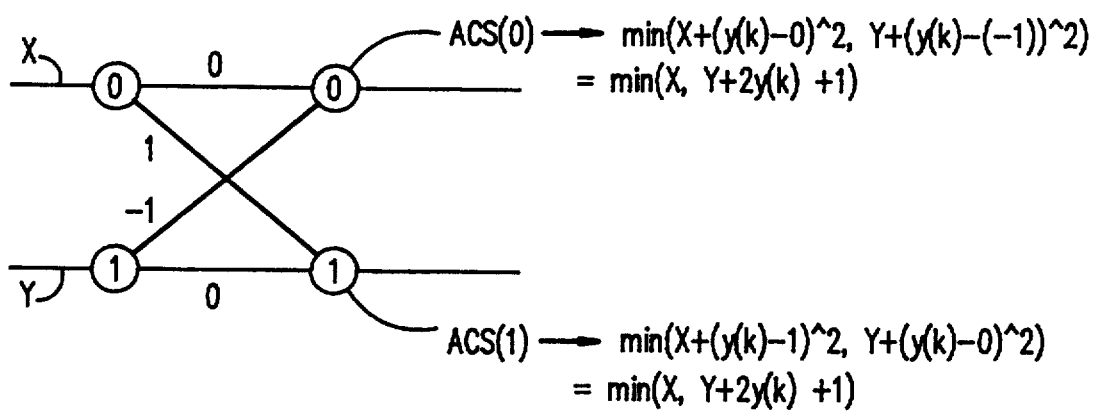
FIGS. 8A–8E set out the DICODE partial response trellis transformation for Viterbi decoding in the whitened matched filter (WMF) case and for the matched filter (MF) cases under respective $\{+1,-1\}$ and $\{0,1\}$ inputs. These figures include intermediate steps in the branch metric shifting according to the invention.
Figure 8B:
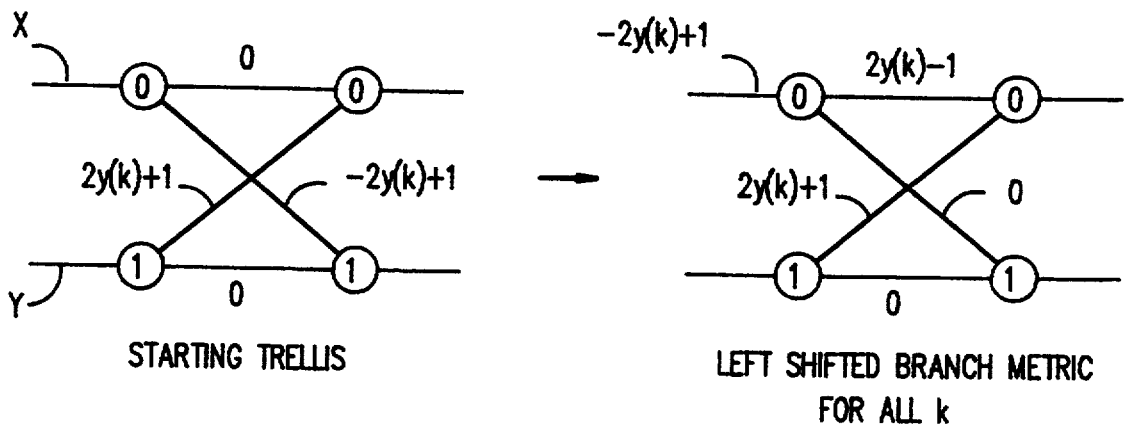
Figure 8B:
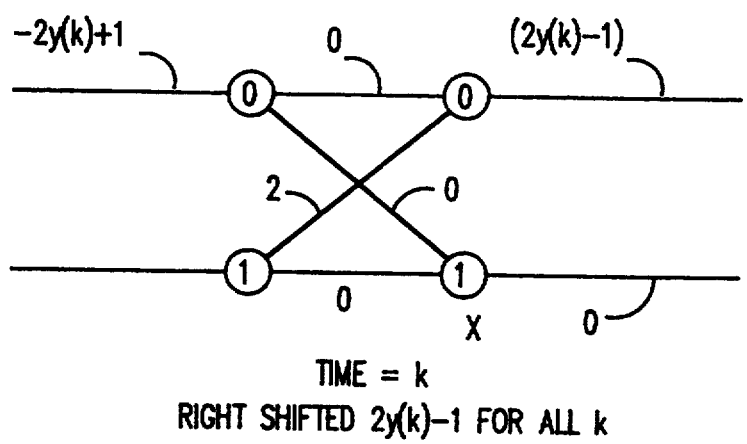
Figure 8B:
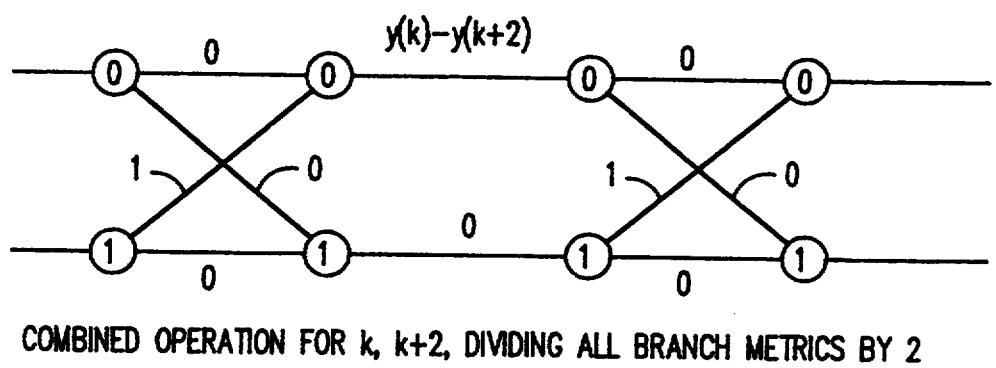

For the magnetic recording channel, the input comprises only binary symbols. These may be represented in terms of $\{+1, -1\}$ or $\{0,1\}$ levels, resulting in two cases of interest. These are referred to as "case $(+/-1)$": $\{a_k\}$ is a member of the set $\{-1,1\}$, or "case(01)": $\{a_k\}$ is a member of the set $\{0,1\}$. Because of the dc-free nature of the PR4 channel, both cases yield the same trellis of FIG. 8A. This trellis can be transformed by shifting branch metrics and dividing by 2, also as shown in FIG. 8B. Here, the addition of branch metric $-2y_k + 1$ has been left-shifted over the upper left node in FIG. 8B and, the addition of $2y_{k+1}$ has been right-shifted over the upper right node.

Since dynamic programming only depends on the existence of the distributive law of maximum/minimum selection and addition, it can also be applied if the expression is rewritten as $$E - \sum_k y_k^2 = \sum_k a_k^2 + a_{k-2}^2 - 2a_k a_{k-2} + 2y_k(-a_k + a_{k-2})$$

By defining the new "matched filter" (MF) variable $z_k - y_k + y_{k+2}$ and re-ordering the addends the expression for E can be rewritten as $$E - \sum_k y_k^2 = 2 \sum_k a_k(z_k + a_k - a_{k-2})$$

Figure 8C:
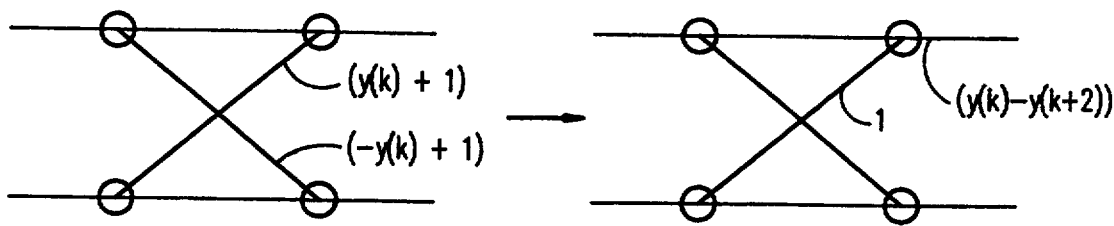
Figure 8D:
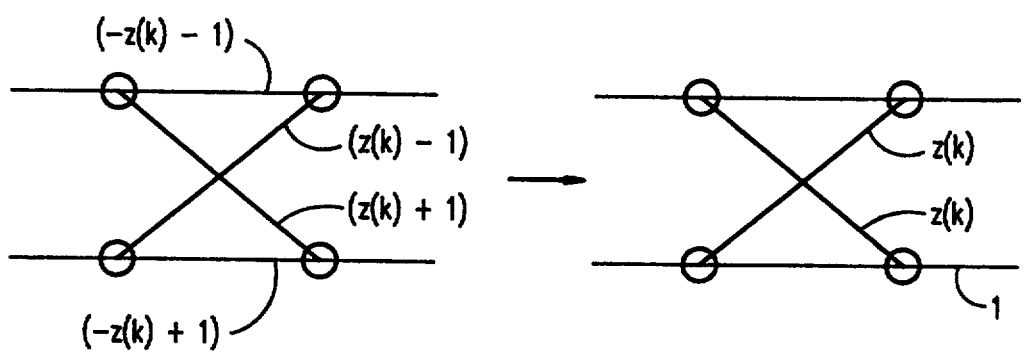
Figure 8E:
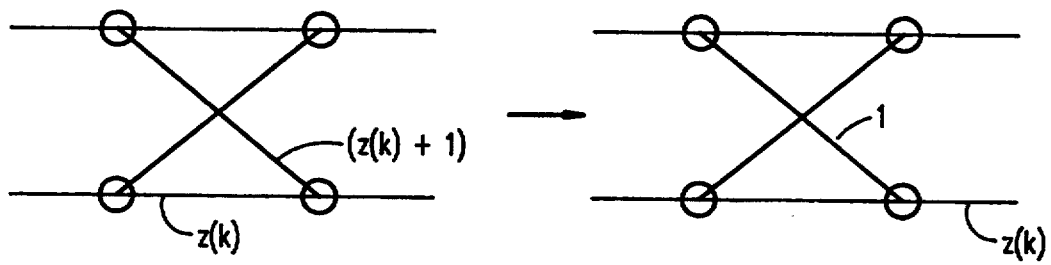

Drawing the trellis for applying dynamic programming to leads to FIG. 8D for case$(+/-1)$ and to FIG. 8E for case(01), which can be transformed by shifting branch metrics as shown. Note that for case$(+/-1)$ the constant term $\Sigma a_k^2$ is left out of the minimization i.e. $E - \Sigma y_k^2 + 2a_k^2$ is minimized which is $$E - \Sigma(y_k^2 + 2a_k^2) = 2 \sum_k a_k(z_k - a_{k-2})$$

The result of shifting the branch metrics in case of FIG. 8C and FIG. 8E leads to only one variable addition, and one fixed addition in the butterfly exactly as was discussed at the end of the previous subsection. Hence, the total implementation complexity of the ACS-unit of the Viterbi decoder is approximately only two adders. The case shown in FIG. 8D is not attractive, since it has time varying branch metrics in the butterfly.

It should be noted that for a "charge-state partial response trellis", as is required in detectors for matched spectral-null codes, the transformations and results described above also apply directly. The amount of hardware saving and the required complexity is similar: about one adder per state, which reflects about a 50% reduction relative to conventional architectures.

Difference Metric for PR4

The difference metric approach for PR4 can also be applied to the branch-shifted trellises of FIGS. 8A–E. The transformed trellises in FIG. 8C (WMF, case(+/−1), case(01)) and FIG. 8E (MF, case(01)) yield identical update recursions for the difference metric $\delta_k$, which is defined as the upper path metric minus the lower one, as given by:

$$\delta_{k+1} = \begin{cases} -z_k & (1) \\ \delta_k - z_k & (2) \\ -1 - z_k & (3) \end{cases}$$

(1) applies for all $\delta_k > 0$; (2) applies where $-1 < \delta_k \leq 0$, and (3) is used where $\delta_k \leq 1$.

This recursion, which derives from both the branch-shifted MF trellis and the branch-shifted WMF trellis, is equivalent to the conventional difference metric formulation of the MF case, but differs from the conventional difference metric formulation of the WMF case.

Extended Class 4 Partial Response (EPR4)

In case of EPR4 as described in Thapar et al, "A Class of Partial response Systems for Increasing Storage Density in Magnetic Recording", IEEE Trans. Magnetics, vol MAG-23, pp. 3665–3668, September 1987, the normalized sum of squared-errors in case of WMF branch metrics equals $$E - \sum_k y_k^2 = \sum_k (y_k - (a_k + a_{k-1} - a_{k-2} - a_{k-3}))^2 - y_k^2$$

Figures 9A, 9B:
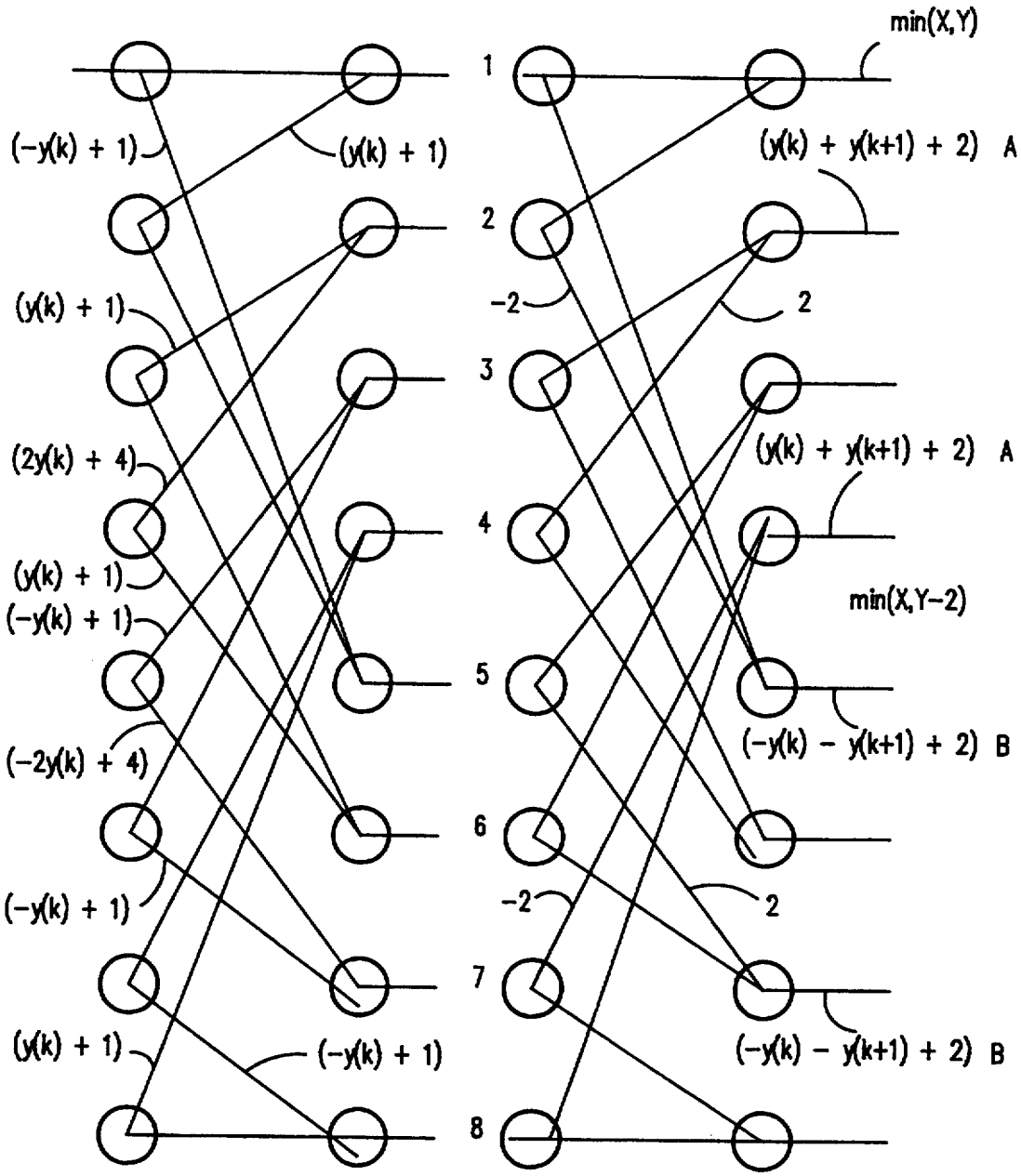
FIGS. 9A–9B shows the trellis transformation according to the invention for the extended partial response (EPR4) using a whitened matched filtering and $\{+1,-1\}$ inputs.
Figure 10:
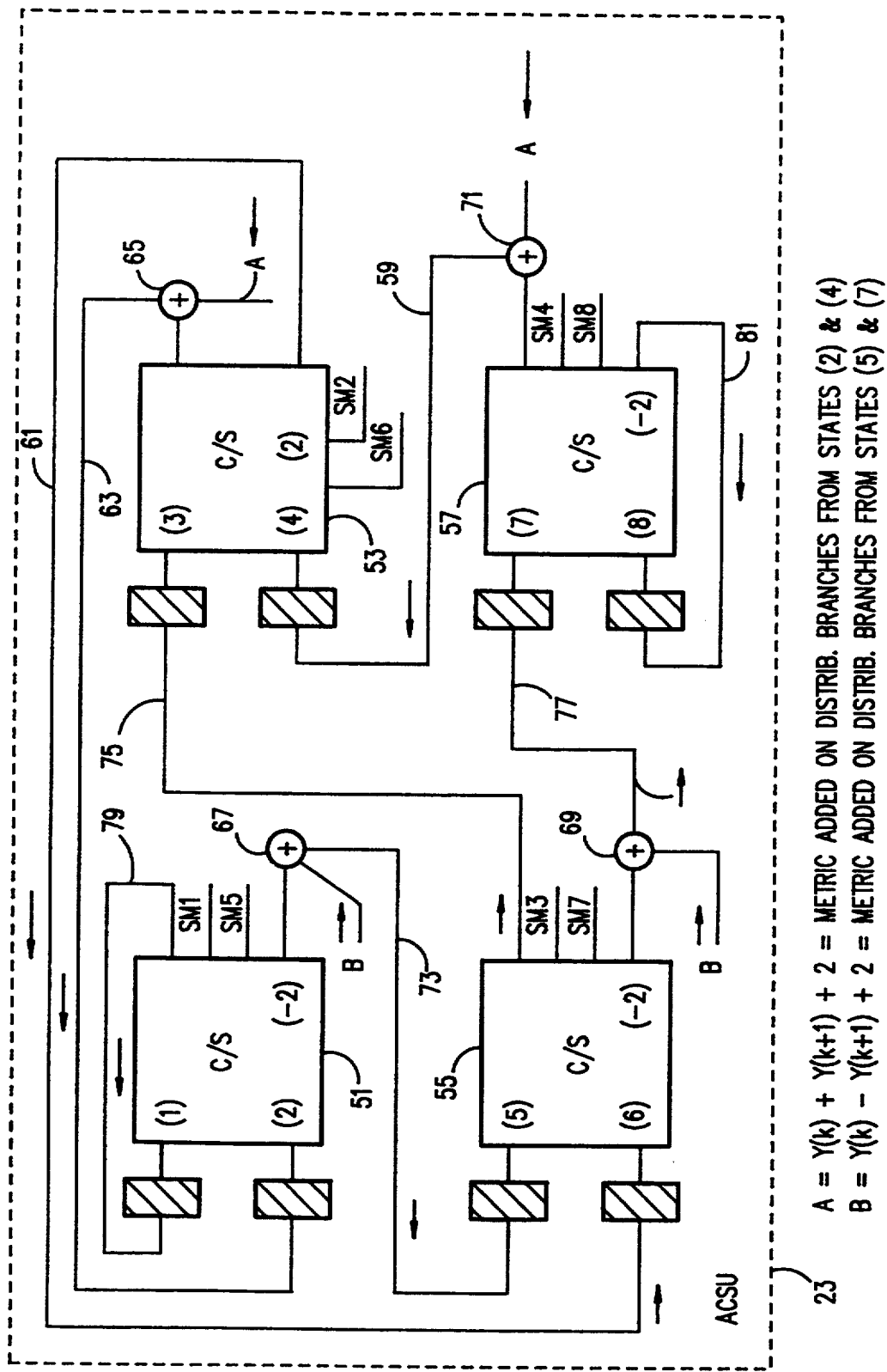
FIG. 10 exhibits the ACSU of the Viterbi decoder modified to operate upon the trellis of FIG. 9B.

Referring now to FIGS. 9A, 9B, and 10, there is shown the original trellis for case(+/−1) in FIG. 9A, the trellis as modified after branch metric shifting in FIG. 9B, the recursive ACSU processor 23 for logically combining the metrics applied to the eight state nodes of the instant stage to yield resultants (survivors) per FIG. 9B for the next iterative code cycle.

Figure 11:
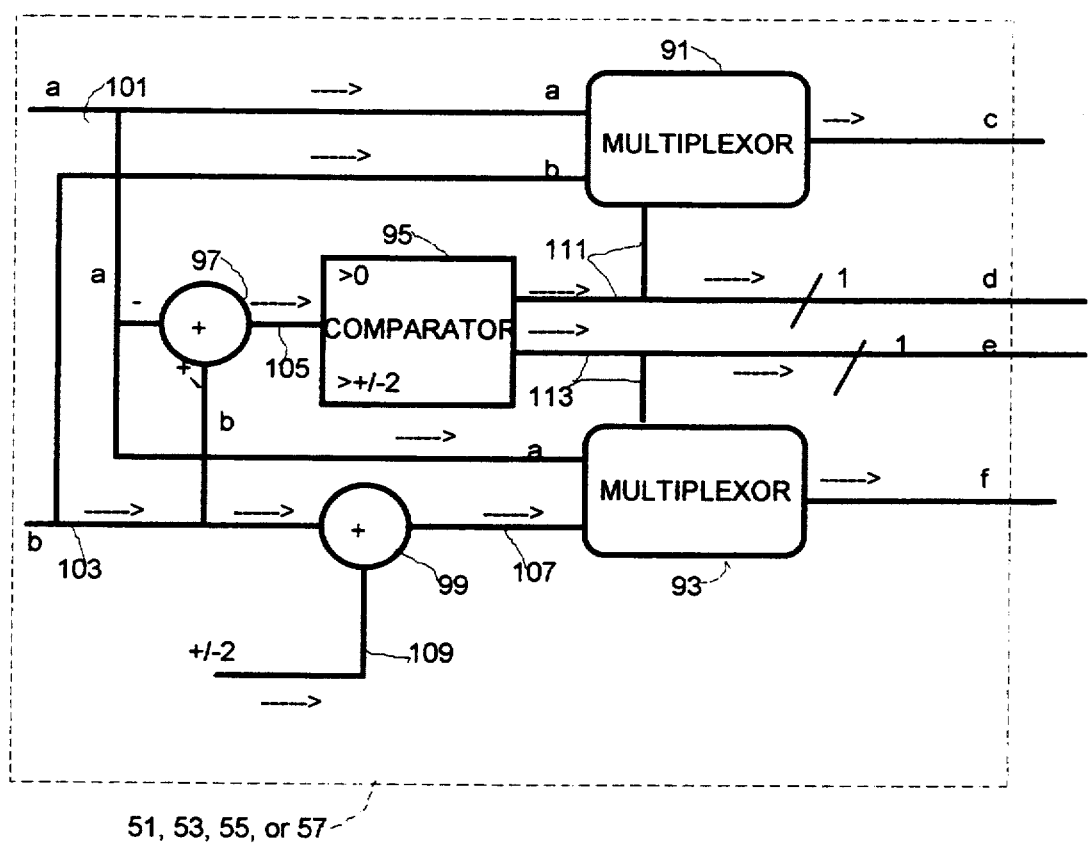
FIG. 11 sets out a compare/select unit shown in FIG. 10.

The implementation of the Viterbi detector based on the transformed trellis of FIG. 9B is set out in FIG. 10. Each of the logic units 51, 53, 55, 57, abbreviated as C/S for compare select, represents a compare-select block that compares the two state-metric inputs to produce the survivor metrics as well as the survivor-sequence pointers, sm1, sm2, ... sm8. The pointers are used to control the contents of the path memory, which may be organized using the trace back or the register-exchange configuration. A block diagram of the C/S units is depicted in FIG. 11. Even though shown separately, the add and the decision functions may be lumped together as one logical function.

Inputs A and B are applied as inputs to pairs of adders 67 and 69 for B and 65 and 71 for A. Each of the eight states ((1), (2), ... (8)) of the trellis in FIG. 9B is marked as an input into a counterpart C/S unit on the left side thereof. Thus, states (1) and (2) are associated with C/S 51, (3) and (4) with C/S 53, (5) and (6) with C/S 55, and (7) and (8) with C/S 57.

Turning attention to C/S 51, the survivor metric output from C/S 51 for state (5) is combined with quantity B in adder 67, and, the sum is fed to C/S 55 input (5) for the next cycle of computation for states (3) and (7). Similarly, for C/S 53, the survivor metric for state (2) is combined with quantity A in adder 65 and the sum is fed to C/S 51 input (2) on line 63 for the next cycle of computation for states (1) and (5). The survivor metric for state (6) is routed on line 61 to C/S 55 input (6) for the next cycle of computation for states (3) and (7).

For C/S 55, the survivor metric output for state (3) is fed online 75 to input (3) of C/S 53 for the next cycle of computation for states (2) and (6). The output for state (7) is combined with quantity B in adder 69. The sum is routed on line 77 to input (7) of C/S 57 for the next cycle of computation for states (7) and (8).

Finally, for C/S 57, the output for state (4) is combined with quantityt A in adder 71, the result being fed back on line 59 to input (4) of C/S 53 for states (2) and (6). The output for state (8) is fed back on line 81 to input (8) of C/S 57 for the next cycle of computation for states (4) and (8).

Operationally, a cycle of the modified Viterbi detector recursion involves the following steps, described in reference to the trellis structure of FIG. 9B and the functionally equivalent ACSU implementation of FIG. 10. The inputs to the ACSU are the 8 survivor metrics. These can be associated conceptually with the trellis states on the left side of FIG. 9B, and are stored in the corresponding registers (shaded rectangles) depicted in pairs at the input to the 4 compare/select blocks in FIG. 10. Metrics 1 and 2 are applied to C/S block 51, metrics 3 and 4 are applied to C/S block 53, metrics 5 and 6 are applied to C/S block 55, and metrics 7 and 8 are applied to C/S block 57.

During the detection cycle, each state on the right hand side of FIG. 9B compares the pair of metrics provided to it by the branch interconnections from the left-hand side states, after each metric has been modified by adding the constant value on the connecting branch (either 0,2, or −2). The minimum modified metric is determined, and the state generates a pointer indicating which of the two was selected. This pointer is supplied to the survivor memory unit (SMU). The selected metric value is fed back, after the addition of the value on its distribution branch, to the corresponding state at the next stage.

The circuit of FIG. 10 executes the same function as follows. The states on the right hand side of the trellis of FIG. 9B can be grouped together in pairs determined by the two survivor metrics applied to them. Specifically, states 1 and 5 receive metrics supplied from states 1 and 2; states 2 and 6 are supplied from states 3 and 4; states 3 and 7 from states 5 and 6; and states 4 and 8 from states 7 and 8. The block 51 is a modified (two-level) compare/select that performs in parallel the operations described above for states 1 and 5. The detailed function performed by such a compare/select block is described in FIG. 11.

Referring now to FIG. 11, the input survivor metric from state 1, denoted "a", is supplied on line 101 and routed to the multiplexers (MUX's) 91 and 93, as well as the inverter preceding adder 97. The metric from state 2, denoted "b" is supplied on line 103 and routed to MUX 91 and the adders 99 and 97. Adder 97 supplies the quantity "b−a" to comparator 95 on line 105. Adder 99, supplied with the quantity "−2" on line 109, sends the computed quantity "b−2" to MUX 93 on line 107.

Comparator 95 compares "b−a" to 0, corresponding to the comparison at state 1, and compares "b−a" to 2, corresponding to the comparison at state 5. Two single-bit outputs indicating the results of the comparisons are carried on lines 111 and 113 respectively. These serve as the survivor memory pointers sm1 (denoted "d") and sm5 (denoted "e"). These single-bit values are also routed to MUX 91 and MUX 93 respectively, causing the smaller of the MUX 91 inputs "a" and "b" to be selected and output as quantity "c", and the smaller of MUX 93 inputs "a" and "b-2" to be selected and output as quantity "f".

Referring back to FIG. 10, the output "c" is supplied on line 79 to the survivor metric latch on compare-select block 51 corresponding to state 1, and the output "f" is supplied to adder 67 where it is augmented by the distribution branch metric B, the sum being routed on line 73 to the input latch on compare-select block 55 corresponding to state 5.

Similar descriptions apply to the operation of blocks 53, 55, and 57. It is clear that the overall function performed in one detection cycle by the circuit in FIG. 10 is equivalent to that performed by the Viterbi detector represented by the two-iteration trellis of FIG. 9B.

Note that the configuration in FIG. 10 is organized in the form of compare-select-add operations. By simply moving the adders (involving A and B values) through the survivor metric registers, the configuration may be re-cast into the conventional add-compare-select ordering of operations.

General Simplifications for Partial Response Signaling

In the preferred embodiments, the branch-metric shifting tool will be applied to simplify the implementation of both the matched-filter (MF) and whitened-matched-filter formulations of Viterbi detectors for specific partial response channels. Here, we show that these hardware simplifications hold generally for the Viterbi detector corresponding to any ISI (intersymbol-interference) channel model.

First, consider the structure of an ISI-cancellation trellis. For a channel with a memory of L symbols, each state is specified by one data vector $(a_{k-1}, \ldots, a_{k-L})$. Every possible value of this vector uniquely identifies a state, hence for an m-ary symbol set the trellis has exactly $m^L$ states. Another consequence is that each state has exactly m preceding, and m following states. The preceding states and the current state labels have $L-1$ common elements of their identifying data vector; the same holds for the current state and the following states. These observations will be used in the following subsections to define the appropriate branch metrics for the MF and WMF cases.

Generalization for MF Branch Metrics

In the case of matched filter (MF) branch metric computation, the branch metric is $$a_k \left( z_k + \sum_{i=0}^{L} f_i a_{k-i} \right)$$

where $f_i$ is the auto correlation of the channel matched filter impulse response. The add-compare-select operation for state $(a_k, \ldots, a_{k-L+1})$ is performed over the m possible values of $a_{k-L}$.

Hence all "constant" terms in the minimization may be dropped during the minimization and added afterwards. In particular, this applies to the term $a_k z_k$. Hence, the only term incorporating $z_k$ can be added after the select operation, leaving a trellis with separate selection nodes and distribution nodes, as was previously discussed in connection with branch metric shifting. Note, the only "non-constant" term in the compare-select operation is $a_{k-L}$, the oldest data symbol.

Taking constant terms out of the minimization leads to a compare-select-add type of recursion. This also affects the depiction of the trellis diagram. A relevant way of drawing the trellis is to draw one step of the recursion by two "half-steps", one step to indicate the necessary compare-select operations, and the other step to show the addition operation involving parallel branches. As is well-known, an ISI-trellis can be depicted with the shuffle-exchange structure. Therefore, using the above perspective, the two "half-step" depiction of the ISI-trellis would have one shuffle-exchange interconnection step and one plain step with parallel branches.

Now the important fact is that the branch metrics of the shuffle exchange interconnection are all determined only by the channel impulse response. Hence for time-invariant ISI, such as that found in partial response channels, they are data-independent and time-invariant. Applying the branch shifting therefore always leads to a simple two-level compare in case of binary input alphabets.

The data-dependent term $a_k z_k$ is associated with a branch that connects a selection node with a distribution node. In case of binary inputs, this term is zero or can be normalized to zero for half of the branches, as was shown in the previous section.

Generalization for WMF Branch Metrics

The branch metric computation in case of a whitened matched filter (WMF) approach is $$\left( y_k - \left( \sum_{i=0}^{L} a_{k-i} h_i \right) \right)^2 - y_k^2 = -2 y_k \left( \sum_{i=0}^{L} a_{k-i} h_i \right) + \left( \sum_{i=0}^{L} a_{k-i} h_i \right)^2$$

where $h_i$ is the combined channel and whitening filter impulse response. In this case the data-dependent term can be split into two additive parts, as $$-2y_k \left( \sum_{i=0}^{L} (a_{k-i}h_i) \right) = -2y_k \left( \sum_{i=0}^{L-1} a_{k-i}h_i \right) - (2y_{k-L}a_{k-L}h_L)$$

The first part is "constant" in the select operation, whereas the second part is not. However, the second part is an additive offset that is common for all branches leaving a distribution node, and hence can be shifted before that node. This is the "left shifting operation" mentioned previously. This leads to the fact that the simple branch between a selection and a distribution node always has a branch metric which is a linear combination of two contiguous sample values $y_k$ and $y_{k-1}$, i.e., it is of the form $Ay_k + By_{k-1}$.

The consequences of this transformation are the same as for the MF case: namely, reducing the complexity of the add-compare-select hardware substantially for partial response channels. The overall conclusion is that the complexity of the add-compare-select for any binary partial response Viterbi decoder with N states is approximately N adders, where N/2 adders are required for the addition of the data-dependent branch metrics, and the remaining N/2 adders make up the complexity of the N/2 two-level compares.

Reduction in Complexity

The reduction in Viterbi detector implementation complexity utilizing the method and means of this invention is best exemplified by reference to the trellis structures in FIGS. 9A-9B and counterpart logic depicted in FIGS. 10 and 11.

It should be appreciated that the conventional trellis in FIG. 9A comprises 8 states corresponding to ACS units. Each of the trellis branches is labeled with the branch metric to be added at time k, using the convention that no label corresponds to addition of the branch metric "0". As is easily confirmed, there are 10 non-zero branch metrics, all involving the data dependent variable Y(k), implying that 10 variable adders are required. Each ACS also requires a 2-input compare-select circuit, so 8 such circuits are required.

In contrast to the current state of the art, the transformed trellis as shown in FIG. 9B has no variable adders associated with the branch metrics, only 4 fixed additions (corresponding to the branches labeled 2 an −2), whose implementation has a substantially smaller complexity than variable adders. On the distribution (horizontal) branches, there are only 4 variable additions required, corresponding to the non-zero "shifted" branch-metrics, denoted A and B in FIG. 10.

Significantly, the structure of the transformed trellis also permits savings in the compare-select logic. By a slight modification, a "two-level" compare-select architecture allows each such circuit to service 2 states (the states that have the same pair of predecessor states). Thus, the total number of compare-select circuits is 4, instead of the 8 comparators in the conventional architecture.

The complexity of these modified comparators is in practical terms the same as a standard comparator, which, in turn, is the same as that of an adder.

In the general case for binary, partial-response channels, similar simplifications arise when branch-metric shifting and the disclosed implementation architectures are applied. If the trellis has N states, the resulting architecture requires only N/2 variable additions and N/2 "two-level" compare-selects, compared to the N variable-additions and N compare-selects of the conventional approach. It should also be noted that the routing of connections can also be simplified because of the reduction in the number of circuit components.

Extensions

One extension to the method and means of this invention is the employment of a modified dynamic programming heuristic in the complexity reduction of partial response channels using coded modulation techniques such as spectral null coding by Siegel et al, U.S. Pat. No. 4,567,464, issued Jan. 28, 1986, "Fixed Rate Constrained Channel Code Generating and Recovery Method and Means Having Spectral Nulls for Pilot Signal Insertion".

These and other extensions of the invention may be made without departing from the spirit and scope thereof as recited in the appended claims.

We claim:

1. A Viterbi decoder for producing a maximum likelihood estimate of a binary coded sequence from a convolutionally coded symbol sequence applied to said Viterbi decoder, comprising:

means for assigning metrics to each convolutionally coded symbol as projected onto a trellis directed graph of nodes and branches constituting a finite machine state diagram over time of the impulse response of said Viterbi decoder, each survivor path through the trellis being in the form of a series of metrics termed a "survivor metric sequence" and constituting one of a set of possible binary coded sequences; and means for recursively processing each of said nodes in the trellis during each recursion cycle by shifting branch metric additions over each node to effectuate an ordered set of compare/select/add operations on predecessor survivor metrics terminating in said each node, selecting a survivor sequence at each node by comparing the metrics of each predecessor survivor sequence terminating in said each node, each predecessor survivor sequence being incremented by at most a constant value independent of the recursion, and adding the shifted branch metrics to the metric of the selected survivor sequence at each node.

2. The Viterbi decoder according to claim 1, wherein the convolutionally coded sequence is of the partial response coded type, and further wherein the trellis processed by said recursive means is selected from a set consisting of a partial response impulse function modified either by a matched filter response or a whitened matched filter response.

3. The Viterbi decoder according to claim 2, wherein said means for recursively processing each node in the trellis of a partially coded impulse response comprises:

a path memory;

a plurality (51, 53, 55, 57) of metric comparison and selection units (C/S), each C/S unit having means for comparing a first and a second state-metric input and for producing survivor metrics and a plurality of survivor-sequence pointers (sm1, sm2, . . . sm8); and means responsive to said pointers for maintaining contents of the path memory including means for tracing back over the paths.

4. The Viterbi decoder according to claim 3, wherein each C/S unit comprises a first and second multiplexor (91, 93), a comparator (95), and a first and second adder (97, 99), a first branch metric input (101) being applied to both multiplexors, a second branch metric input (103) being applied to the first multiplexor and combined with a branch shifted input from a predecessor sequence via the second adder and applied as an input to the second multiplexor, said second branch metric input being combined with the first branch metric input via the first adder and applied to the comparator, said comparator including means for applying control signals to the first and second multiplexors.

5. A method for the maximum likelihood detection of original binary coded sequences from partial response waveforms in which a dynamic programming heuristic recursively generates sets of survivor sequences $\{X,Y\}$ as projected onto a labeled directed graph based trellis, said graph based trellis including signal processing nodes and paths to other nodes, said heuristic executing an ordered set of operations (compare, select, add) over survivor sequences incident to each node, each survivor sequence terminating in each node being manifested by a branch metric, said sequences propagating among the nodes according to the directed graph, comprising the recursive steps of:

(a) shifting branch metric additions over the nodes of the graph to effectuate an ordered set of compare/select/add operations on the survivor sequences terminating in each node;

(b) comparing the metrics of each predecessor survivor sequence terminating in each node and selecting a survivor sequence at that node, each predecessor survivor sequence being incremented by at most a constant value independent of recursive step (b); and (c) adding the shifted branch metrics to the metric of the survivor sequence at each node.

6. The method according to claim 5, wherein in the trellis for a first X and a second Y survivor sequence and a first metric $a_k$ on a first branch and a second metric $b_k$ on a second branch both terminating in a node during the k-th recursion, processing said metrics such that:

$$\max(X+(a_k-a_k), Y+(b_k-a_k))+a_k = \max(X+a_k, Y+b_k).$$

7. The method according to claim 5, wherein each node in the trellis terminates at least two paths or branches, the metrics associated therewith include a difference metric $\delta_k$ for the k-th recursion, which is defined as the upper path metric minus the lower path metric, where:

$$\begin{align} -z_k & \quad (1) \\ \delta_{k+1} = \delta_k - z_k & \quad (2) \\ -1 - z_k & \quad (3) \end{align}$$

(1) applies for all $\delta_k > 0$, (2) applies where $-1 < \delta_k \leq 0$, and (3) applies where $\delta_k \leq 1$.

8. The method according to claim 5, wherein in a butterfly trellis for the decoder in which for the k-th recursion, $a_k$ and $c_k$ are the metrics terminating in a first node while $b_k$ and $d_k$ are the metrics terminating in a second node, the metrics $A_k, B_k,$ and $C_k$ being shifted per steps (a) and (b) according to the relations $A_k = a_k$; $B_k = -a_{k-1} + b_{k-1} + c_k$; $C_k = a_k - b_k - c_k + d_k = $ constant.

9. The method according to claim 5, wherein a matched filter (MF) trellis manifests the branch metric $$a_k \left( z_k + \sum_{i=0}^{L} f_i a_{k-1} \right)$$

wherein said trellis also manifesting a MF impulse response, $f_1$ being the auto correlation of the MF impulse response, steps (a)–(c) being executed for state $(a_k, \ldots, a_{k-L+1})$ over the m possible values of the survivor sequence $a_{k-L}$, $z_k = -y_k + y_{k+2}$, being the MF variable where $\{y_k\}$ represents coded partial response waveforms.

* * * * *